US006131274A

United States Patent [19]
Koradia et al.

[11] Patent Number: 6,131,274
[45] Date of Patent: Oct. 17, 2000

[54] APPARATUS AND METHOD FOR GUIDING A CIRCUIT BOARD INTO AN ELECTRONIC CHASSIS

[75] Inventors: Amir Koradia, Palatine; Douglas J. Pogatetz, Arlington Heights; Philip A. Ravlin, Bartlett; Gerald A. Greco, Elk Grove Village, all of Ill.

[73] Assignee: 3Com Corporation, Rolling Meadows, Ill.

[21] Appl. No.: 09/345,348

[22] Filed: Jul. 1, 1999

[51] Int. Cl.⁷ .............................. H05R 3/36; B23P 19/00
[52] U.S. Cl. .............................. 29/830; 29/759; 29/760; 361/752; 361/753; 361/785; 361/790
[58] Field of Search ............................. 29/830, 842, 840, 29/841, 759, 760; 361/752, 753, 801, 785, 790

[56] References Cited

U.S. PATENT DOCUMENTS

| | | |
|---|---|---|
| 3,775,643 | 11/1973 | Schachnow et al. . |
| 3,939,382 | 2/1976 | Lacan et al. . |
| 4,752,911 | 6/1988 | Prevost et al. . |
| 5,065,141 | 11/1991 | Whitsitt . |
| 5,653,596 | 8/1997 | Banakis et al. . |
| 5,680,294 | 10/1997 | Stora et al. . |
| 5,691,504 | 11/1997 | Sands et al. . |
| 5,967,633 | 10/1999 | Jung . |

*Primary Examiner*—Carl J. Arbes
*Attorney, Agent, or Firm*—Baniak Nicholas Pine & Gannon

[57] ABSTRACT

An apparatus for guiding a circuit board into an electronic chassis includes a circuit board guide having an end portion. An insertion guide member is positioned adjacent to the end portion of the circuit board guide to guide the circuit board into the electronic chassis and to prevent the circuit board from contacting the end portion of the circuit board guide.

15 Claims, 4 Drawing Sheets

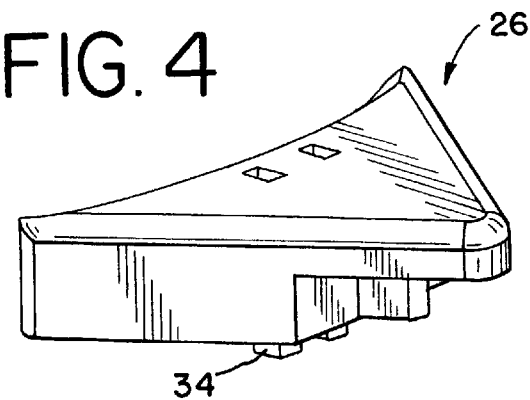
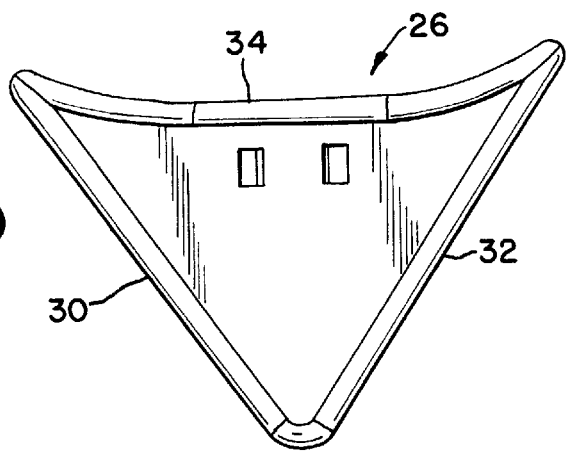
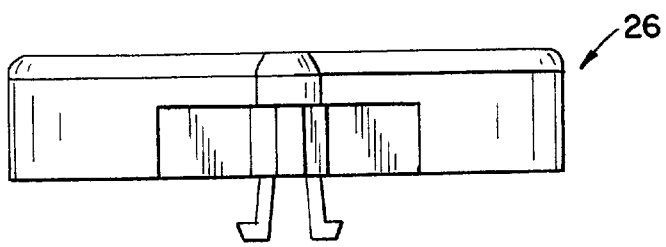
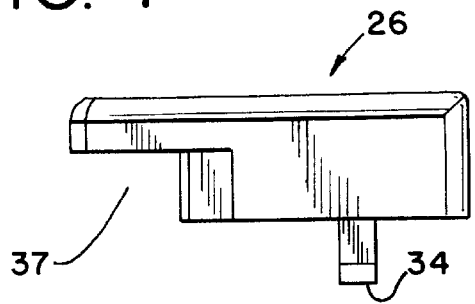

APPARATUS AND METHOD FOR GUIDING A CIRCUIT BOARD INTO AN ELECTRONIC CHASSIS

FIELD OF THE INVENTION

This invention relates generally to the field of electronic chassis and, in particular, to an apparatus and method for guiding a circuit board into an electronic chassis.

BACKGROUND OF THE INVENTION

An electronic chassis which houses electronic components for high speed telecommunication and networking applications typically includes a plurality of vertically oriented circuit boards that are inserted into the chassis. A plurality of circuit board guides are typically located along the bottom of the chassis that define a plurality of slots that guide the circuit board as it is being inserted into the chassis. Conventional circuit board guides are typically formed in a bottom wall of the electronic chassis.

Conventional circuit board guides are generally rectangular in shape and extend along the bottom of the electronic chassis. However, certain circuit board guides do not extend all the way from front of the chassis to the back of the chassis. As a result, the front end of each of the card guides (the end closest to the front of the chassis), which is generally perpendicular to the slots formed between the circuit board guides, is typically located well inside of the front of the chassis. As a result, there is a significant gap between the front of the chassis and the point at which the slots begin.

The disadvantage of this arrangement is that during insertion of the circuit boards into the chassis, the leading edge of the circuit board may contact the front end of one of the circuit board guides unless the circuit board is perfectly aligned with one of the slots. This arrangement does not allow for any variance in the alignment of the circuit board, which may make the initial insertion of the circuit board into the chassis difficult.

Accordingly, it would be desirable to have an apparatus for aligning a circuit board assembly to an electronic chassis that overcomes the disadvantages described above.

SUMMARY OF THE INVENTION

One aspect of the invention provides an apparatus for guiding a circuit board into an electronic chassis. An electronic chassis includes a circuit board guide having an end portion. An insertion guide member is positioned adjacent to the end portion of the circuit board guide to guide the circuit board into the electronic chassis and to prevent the circuit board from contacting the end portion of the circuit board guide. The insertion guide member may preferably be attached to the electronic chassis. In particular, the insertion guide member may preferably be attached to a bottom portion of the electronic chassis. The insertion guide member may preferably include a first side, a second side, and a third side, and may form a generally triangular shape. The electronic chassis may preferably include an opening, and the insertion guide member may preferably include a snap portion. The snap portion may preferably be received in the opening of the electronic chassis to secure the insertion guide member to the electronic chassis.

Another aspect of the invention provides an apparatus for guiding a circuit board into an electronic chassis. An electronic chassis includes a first circuit board guide and a second circuit board guide. The first circuit board guide includes an end portion, and the second circuit board guide includes an end portion. A first insertion guide member is positioned adjacent to the end portion of the first circuit board guide and a second insertion guide member is positioned adjacent to the end portion of the second circuit board guide. This allows the circuit board to be inserted between the first and second insertion guide members and to prevent the circuit board from contacting the end portion of the first circuit board guide and the end portion of the second circuit board guide.

Another aspect of the invention provides a method for guiding a circuit board into an electronic chassis. An electronic chassis including a first circuit board guide and a second circuit board guide is provided. The first circuit board guide includes an end portion and the second circuit board guide includes an end portion. A first insertion guide member is positioned adjacent to the end portion of the first circuit board guide and a second insertion guide member is positioned adjacent to the end portion of the second circuit board guide. The circuit board is positioned between the first and second circuit board guides. The circuit board is inserted into the electronic chassis. The circuit board is prevented from contacting the end portion of the first circuit board guide and the end portion of the second circuit board.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and equivalents thereof

BRIEF DESCRIPTION OF THE DRAWINGS

FIG. 4 is a perspective view of the insertion guide member shown in FIG. 1;

FIG. 5 is a top view of the embodiment of FIG. 4;

FIG. 6 is a front view of the embodiment of FIG. 4; and

FIG. 7 is a side view of the embodiment of FIG. 4.

DETAILED DESCRIPTION OF THE PRESENTLY PREFERRED EMBODIMENTS

Figure 1:
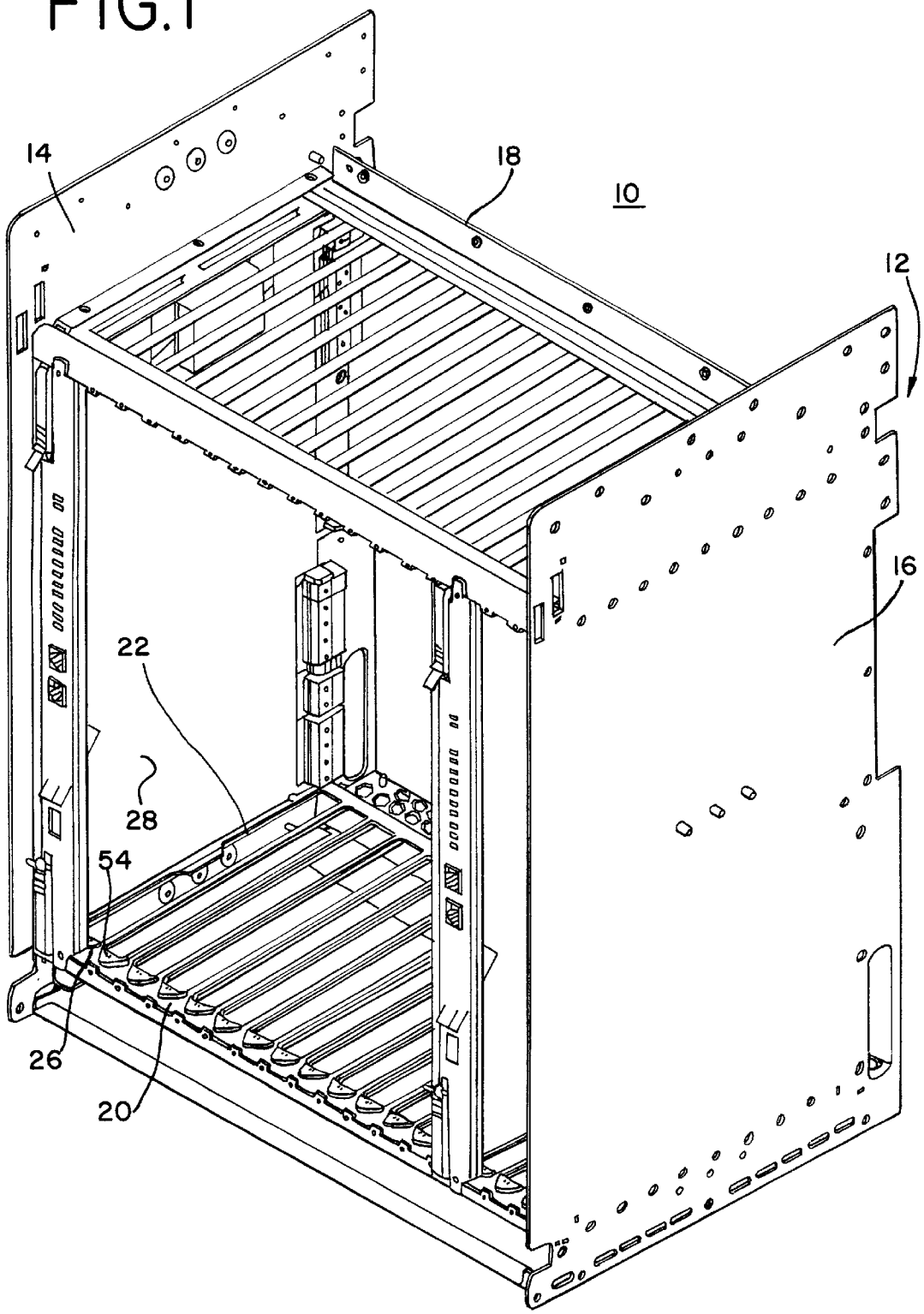
FIG. 1 is a perspective view of a preferred embodiment of an apparatus for guiding a circuit board into an electronic chassis that is made in accordance with the invention.
Figure 2:
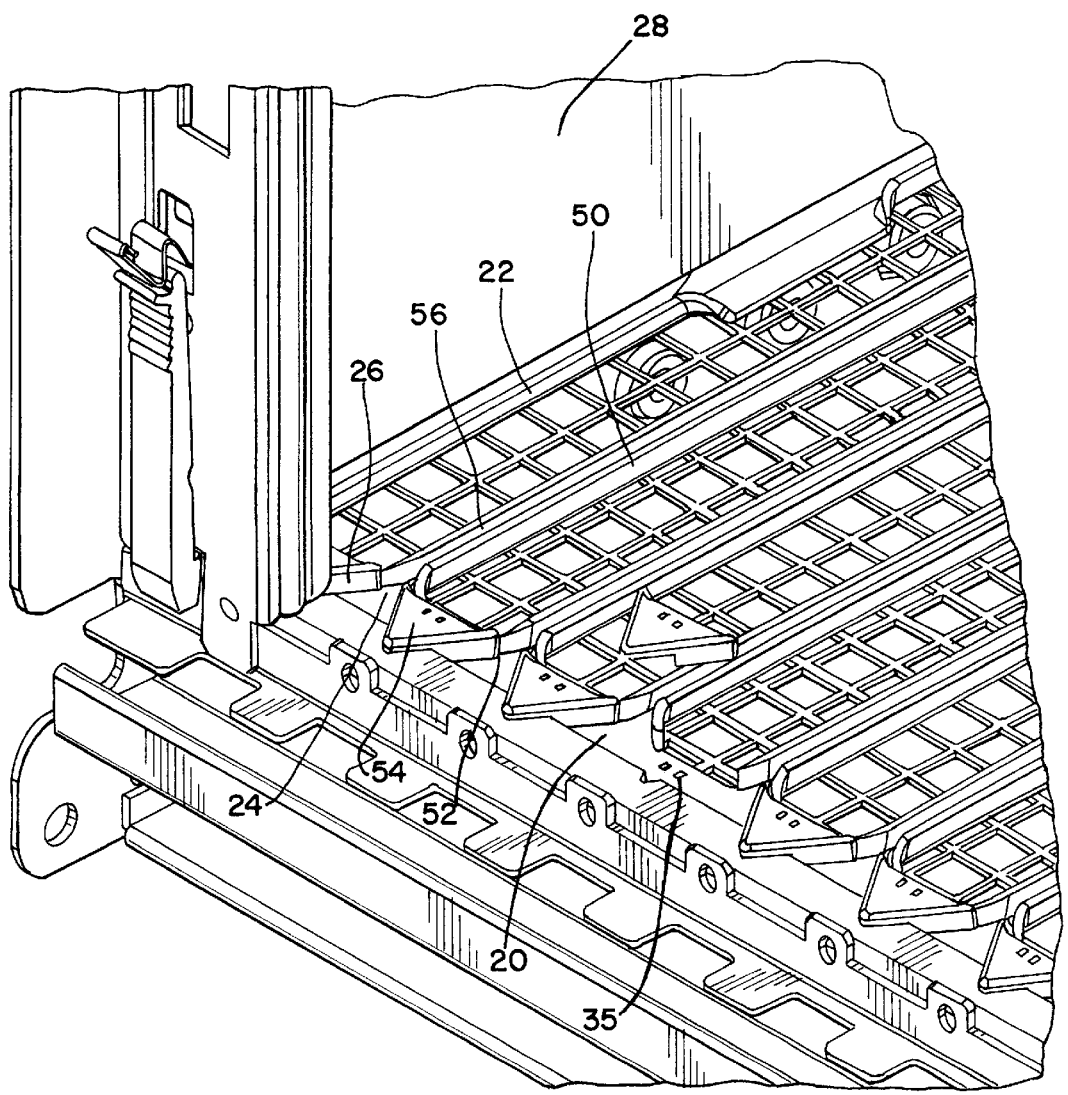
FIG. 2 is an enlarged partial view of the embodiment of FIG. 1.
Figure 3:
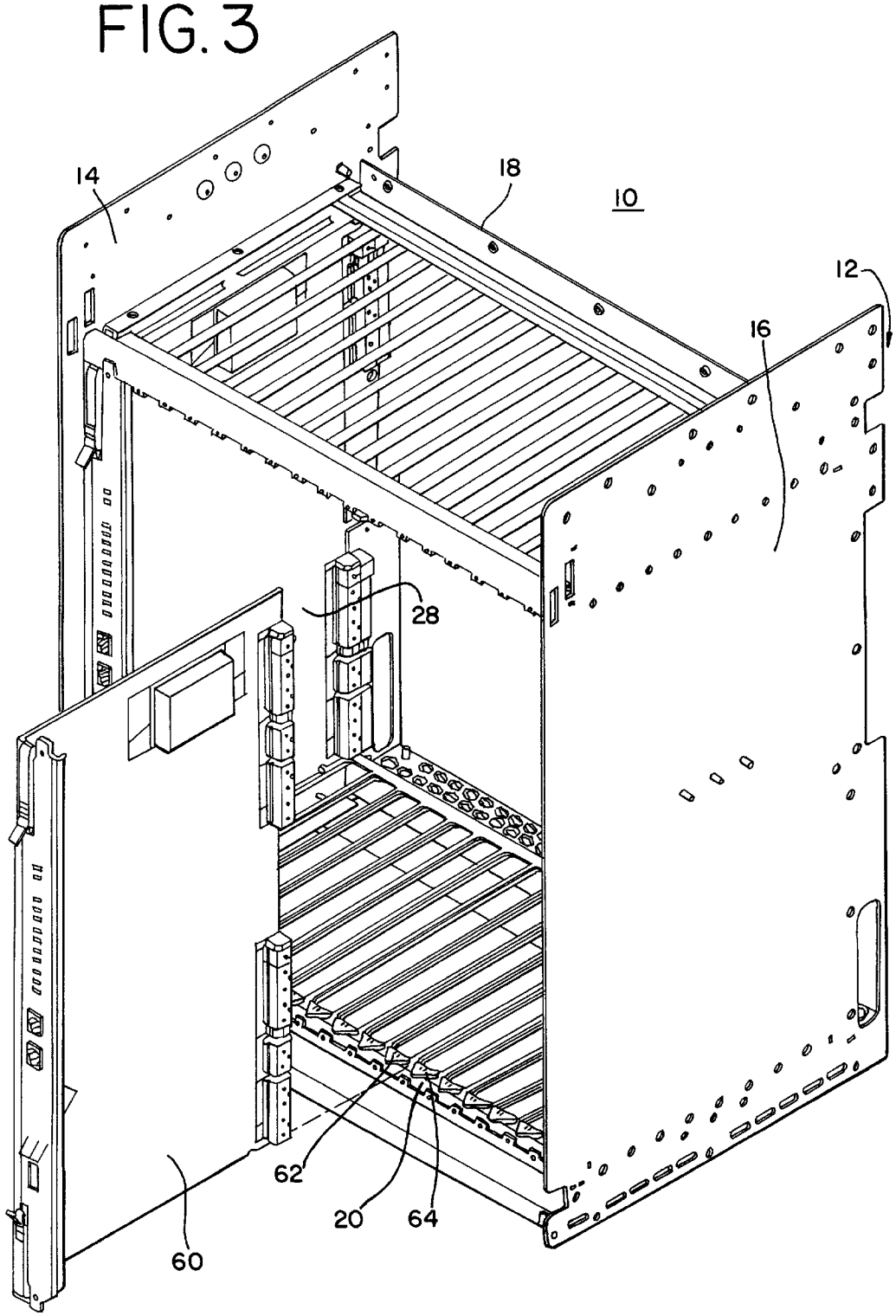
FIG. 3 is a perspective view of the electronic chassis depicted in FIG. 1 showing a circuit board exploded from the electronic chassis.

As shown in FIGS. 1–3, a preferred embodiment of an apparatus 10 for guiding a circuit board into an electronic chassis includes an electronic chassis 12. The electronic chassis 12 may preferably be any suitable rigid enclosure for housing various electronic components for high-speed telecommunication and networking applications. The electronic chassis 12 may preferably be a box-like structure having side walls 14, 16, a top portion 18, and a bottom portion 20.

As shown in greater detail in FIG. 2, the electronic chassis 12 includes a circuit board guide 22. The circuit board guide 22 includes an end portion 24. In the embodiment shown, the end portion 24 may preferably be located near the front of the electronic chassis 12. As shown in FIGS. 1 and 3, the circuit board guide 22 may preferably be rectangular in shape and may extend generally from a point near the front of the electronic chassis 12 to a point near the back of the electronic chassis 12. As shown in FIGS. 1–3, the circuit board guide 22 may preferably be located in the bottom portion 20 of the electronic chassis 12. In particular, the circuit board guide 22 may preferably be formed in a bottom wall of the electronic chassis 12. Alternatively, the circuit board guide 22 may be a separate component that is attached to the electronic chassis 12.

An insertion guide member 26 is positioned adjacent to the end portion 24 of the circuit board guide 22 to guide a circuit board 28 into the electronic chassis 12. The insertion guide member 26 also prevents a circuit board 28 that is inserted into the electronic chassis 12 from contacting the end portion 24 of the circuit board guide 22. The circuit board 28 may be any conventional printed circuit board. The insertion guide member 26 may preferably be attached to the electronic chassis 12. In the embodiment shown, the insertion guide member 26 may preferably attached to the bottom portion 20 of the electronic chassis 12.

The insertion guide member 26 is shown in greater detail in FIGS. 4–7. In the embodiment shown, the insertion guide member 26 preferably has a generally triangular shape, although various shapes and configurations are contemplated. The insertion guide member 26 may preferably include a first side 30, a second side 32, and a third side 34. The insertion guide member 26 may also preferably include a recessed portion 37 to ensure that the insertion guide member 26 does not interfere with other components of the electronic chassis 12.

As shown in FIG. 5, the first, second and third sides 30, 32, 34 each may preferably be approximately 0.6 inches in length. The insertion guide member 26 may preferably have thickness of approximately 0.2 inches. Alternatively, the insertion guide member 26 may have other dimensions depending upon the particular application. The insertion guide member 26 may preferably be comprised of plastic or any other suitable rigid material.

As shown in FIGS. 4 and 7, the insertion guide member 26 may preferably have a snap portion 34. As shown in FIG. 2, the snap portion 34 may preferably be received in an opening 35 in electronic chassis 12 to secure the insertion guide member 26 to the electronic chassis 12. Alternatively, the insertion guide member 26 may preferably be attached to the electronic chassis 12 with conventional fasteners such as, for example, rivets, screws, or bolts. The opening 35 in the electronic chassis 12 may preferably be a slot, although other configurations are contemplated.

As shown in FIG. 2, the electronic chassis 12 may also include a second circuit board guide 50 having an end portion 52. A second insertion guide member 54 is positioned adjacent to the end portion 52 of the second circuit board guide 54. A slot 56 may preferably be formed between circuit board guides 22 and 50. The circuit board 28 may preferably be inserted between the insertion guide members 26 and 54. The first and second insertion guide members 26 and 54 prevent the circuit board 28 from contacting either the end portion 24 of the first circuit board guide 22 or the end portion 52 of the second circuit board guide 50.

As shown in FIGS. 1–3, a plurality of circuit board guides may preferably be located along the bottom portion 20 of the electronic chassis 12. The plurality of circuit board guides may preferably define a plurality of slots. Each of the slots may preferably receive a circuit board such as circuit board 28. A plurality of insertion guide members may also preferably be provided, one insertion guide member for each circuit board guide. As shown in FIG. 3, for example, another circuit board 60 may preferably be inserted between circuit board guides 62 and 64.

A plurality of circuit board guides may preferably be located along the top portion 18 of the electronic chassis 12. The plurality of circuit board guides along the top portion 18 of the electronic chassis 12 may also preferably define a plurality of slots. Each of the slots may preferably receive a circuit board such as circuit board 28. A plurality of insertion guide members, one for each circuit board guide along the top portion 18 of the electronic chassis 12, may also be provided.

In the embodiment shown, the circuit board guides and corresponding insertion guide members positioned along the bottom portion 20 of the electronic chassis 12 are in vertical alignment with the circuit board guides and corresponding insertion guide members positioned along the top portion 18 of the electronic chassis 12. This arrangement ensures that the circuit board 28 is vertically aligned when install into the electronic chassis 12.

In operation, the bottom portion of circuit board 28 is placed between the insertion guide members 26 and 54. Similarly, the top portion of the circuit board 28 is placed between the corresponding insertion guide members located along the top portion 18 of the electronic chassis 12. The circuit board 28 is then inserted into the electronic chassis 12. The insertion guide members 26, 54 (and the corresponding insertion guide members located along the top portion 18 of the electronic chassis 12) guide the circuit board 28 into the slot 56 formed between the circuit board guides 22 and 50. The advantage of this arrangement is that the insertion guide members 26, 54 (and the corresponding insertion guide members located along the top portion 18 of the electronic chassis 12) guide the circuit board 28 into the slot 56 and prevent it from contacting the end portion 24 of the circuit board guide 22 or the end portion 52 of the circuit board guide 50. This facilitates the installation of the circuit board 28 into the electronic chassis 12.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An apparatus for guiding a plurality of vertically oriented circuit boards into an electronic chassis comprising:
    a plurality of circuit board guides spaced apart along a bottom portion of the electronic chassis, each of the plurality of circuit board guides including a first end adjacent to a front side of the electronic chassis, the plurality of circuit board guides defining a plurality of slots for receiving the plurality of vertically oriented circuit boards, each of the plurality of slots configured to receive one of the plurality of vertically oriented circuit boards, a plurality of insertion guide members, one of the plurality of insertion guide members positioned at the first end of each of the plurality of circuit board guides, the plurality of insertion guide members defining a plurality of passageways, the plurality of passageways in communication with the plurality of slots, wherein the plurality of insertion guide members guide the plurality of vertically oriented circuit boards through the plurality of passageways into the plurality of slots and prevent the plurality of vertically oriented circuit boards from contacting the first end of the plurality of circuit board guides.

2. The apparatus of claim 1 wherein the plurality of circuit board guides each has a rectangular shape.

3. The apparatus of claim 1 wherein the plurality of vertically oriented circuit boards comprises at least two vertically oriented circuit boards.

4. The apparatus of claim 1 wherein the plurality of circuit board guides comprises at least three circuit board guides.

5. The apparatus of claim 1 wherein the plurality of slots comprises at least two slots.

6. The apparatus of claim 1 wherein the plurality of insertion guide members comprises at least three insertion guide members.

7. The apparatus of claim 1 wherein the plurality of passageways comprises at least two passageways.

8. The apparatus of claim 1 wherein each of the plurality of insertion guide members is attached to the electronic chassis.

9. The apparatus of claim 8 wherein each of the plurality of insertion guide members is attached to the bottom portion of the electronic chassis.

10. The apparatus of claim 1 wherein each of the plurality of insertion guide members has a triangular shape.

11. The apparatus of claim 10 wherein each of the plurality of insertion guide members includes a first side, a second side, and a third side.

12. The apparatus of claim 11 wherein the first, second and third sides are each approximately 0.6 inches in length.

13. The apparatus of claim 1 wherein the electronic chassis includes a plurality of openings spaced apart along the front side of the electronic chassis and each of the plurality of insertion guide members includes a snap portion received in one of the plurality of openings of the electronic chassis to secure the plurality of insertion guide members to the electronic chassis.

14. A method for guiding a plurality of vertically oriented circuit boards into an electronic chassis comprising the step of:

providing a plurality of circuit board guides spaced apart along a bottom portion of the electronic chassis, each of the plurality of circuit board guides including a first end adjacent to a front side of the electronic chassis, the plurality of circuit board guides defining a plurality of slots, each of the plurality of slots configured to receive one of the plurality of vertically oriented circuit boards, a plurality of insertion guide members, one of the plurality of insertion guide members positioned at the first end of each of the plurality of circuit board guides, the plurality of insertion guide members defining a plurality of passageways, the plurality of passageways in communication with the plurality of slots;

positioning the plurality of vertically oriented circuit board into the plurality of passageways between the plurality of insertion guide members; and inserting the plurality of vertically oriented circuit board through the plurality of passageways into the plurality of slots.

15. The method of claim 14 further comprising the steps of:

preventing the plurality of vertically oriented circuit boards from contacting the first end of the plurality of circuit board guides.

\* \* \* \* \*